(12) United States Patent
Compaan et al.

(10) Patent No.: US 8,829,342 B2
(45) Date of Patent: Sep. 9, 2014

(54) BACK CONTACT BUFFER LAYER FOR THIN-FILM SOLAR CELLS

(75) Inventors: Alvin D. Compaan, Holland, OH (US); Victor V. Plotnikov, Toledo, OH (US)

(73) Assignee: The University of Toledo, Toledo, OH (US)

( * ) Notice: Subject to any disclaimer, the term of this patent is extended or adjusted under 35 U.S.C. 154(b) by 72 days.

(21) Appl. No.: 13/515,686

(22) PCT Filed: Oct. 19, 2010

(86) PCT No.: PCT/US2010/053167
§ 371 (c)(1),
(2), (4) Date: Aug. 1, 2012

(87) PCT Pub. No.: WO2011/049933
PCT Pub. Date: Apr. 28, 2011

(65) Prior Publication Data
US 2013/0174895 A1 Jul. 11, 2013

Related U.S. Application Data

(60) Provisional application No. 61/253,008, filed on Oct. 19, 2009.

(51) Int. Cl.
*H01L 31/0296* (2006.01)
*H01L 31/18* (2006.01)
*H01L 31/073* (2012.01)
*H01L 31/0224* (2006.01)
*H01L 31/075* (2012.01)
*H01L 31/0216* (2014.01)

(52) U.S. Cl.
CPC ............ *H01L 31/073* (2013.01); *Y02E 10/543* (2013.01); *H01L 31/1828* (2013.01); *H01L 31/022425* (2013.01); *H01L 31/075* (2013.01); *Y02E 10/548* (2013.01); *H01L 31/02167* (2013.01)
USPC ........... 136/260; 136/252; 136/255; 136/256; 136/264; 438/57; 438/93; 438/94; 438/95

(58) Field of Classification Search
USPC ................... 136/243–265; 438/57, 93, 94, 95
See application file for complete search history.

(56) References Cited

U.S. PATENT DOCUMENTS 4,251,286 A 2/1981 Barnett
4,251,289 A 2/1981 Moustakas et al.
(Continued)

FOREIGN PATENT DOCUMENTS

GB 2384621 A * 7/2003
JP 08078355 A * 3/1996
WO WO 2009043725 A2 * 4/2009

OTHER PUBLICATIONS

Compaan et al. "High efficiency, magnetron sputtered CdS/CdTe solar cells." Solar Energy 77 (2004) 815-822.*
(Continued)

*Primary Examiner* — James Lin
*Assistant Examiner* — Liesl C Baumann
(74) *Attorney, Agent, or Firm* — MacMillan, Sobanski & Todd, LLC (57) ABSTRACT

A photovoltaic cell structure is disclosed that includes a buffer/passivation layer at a CdTe/Back contact interface. The buffer/passivation layer is formed from the same material that forms the n-type semiconductor active layer. In one embodiment, the buffer layer and the n-type semiconductor active layer are formed from cadmium sulfide (CdS). A method of forming a photovoltaic cell includes the step of forming the semiconductor active layers and the buffer/passivation layer within the same deposition chamber and using the same material source.

28 Claims, 8 Drawing Sheets

(56) References Cited

U.S. PATENT DOCUMENTS

| | | | |
|---|---|---|---|
| 4,536,607 A * | 8/1985 | Wiesmann | 136/249 |
| 4,595,791 A * | 6/1986 | Basol et al. | 136/256 |
| 4,598,306 A | 7/1986 | Nath et al. | |
| 4,686,323 A * | 8/1987 | Biter et al. | 136/249 |
| 5,500,056 A * | 3/1996 | Wada et al. | 136/259 |
| 5,738,731 A * | 4/1998 | Shindo et al. | 136/249 |
| 5,909,632 A * | 6/1999 | Gessert | 438/603 |
| 6,166,319 A | 12/2000 | Matsuyama | |
| 6,169,246 B1 * | 1/2001 | Wu et al. | 136/265 |
| 6,548,751 B2 * | 4/2003 | Sverdrup, Jr. et al. | 136/260 |
| 7,098,058 B1 | 8/2006 | Karpov et al. | |
| 7,141,863 B1 | 11/2006 | Compaan et al. | |
| 7,394,016 B2 | 7/2008 | Gronet | |
| 2006/0162766 A1 | 7/2006 | Gee et al. | |
| 2007/0000537 A1 | 1/2007 | Leidholm et al. | |
| 2008/0041436 A1 | 2/2008 | Lau et al. | |
| 2008/0210303 A1 * | 9/2008 | Lu et al. | 136/260 |
| 2008/0251119 A1 * | 10/2008 | Forehand | 136/255 |
| 2009/0020149 A1 * | 1/2009 | Woods et al. | 136/244 |
| 2009/0211637 A1 | 8/2009 | Eaglesham | |
| 2009/0235986 A1 * | 9/2009 | Hotz et al. | 136/260 |
| 2011/0240123 A1 * | 10/2011 | Lin et al. | 136/260 |
| 2013/0081670 A1 * | 4/2013 | Ashley et al. | 136/246 |

OTHER PUBLICATIONS

Gupta et al. "High efficiency ultra-thin sputtered CdTe solar cells." Solar Energy Materials & Solar Cells 90 (2006) 2263-2271.*

Gupta et al. "High Efficiency 1 Micron Thick Sputtered CdTe Solar Cells." Photovoltaic Specialists Conference of the 31st IEEE, 2005, pp. 235-238.*

Plotnikov et al. "10% Efficiency Solar Cells with 0.5 μm of CdTe." Photovoltaic Specialists Conference (PVSC), 2009 34th IEEE, pp. 001435-001438.*

Young et al. "A New Thinfilm CuGaSe2/Cu(In,Ga)Se2 Bifacial, Tandem Solar Cell with Both Junctions Formed Simultaneously" IEEE 2002, pp. 608-611.*

Machine Translation of JP 08-078355.*

International Search Report, Application No. PCT/US2010/53167, dated Dec. 27, 2010.

Written Opinion, Application No. PCT/US2010/53167, dated Dec. 27, 2010.

* cited by examiner

BACK CONTACT BUFFER LAYER FOR THIN-FILM SOLAR CELLS

CROSS-REFERENCE TO RELATED APPLICATIONS

The present invention claims the benefit of U.S. Provisional Patent Application Ser. No. 61/253,008 filed Oct. 19, 2009.

STATEMENT REGARDING SPONSORED RESEARCH

This invention was made with government support under Grant No. ZXL-5-44205-01 awarded by the U.S. Department of Energy, National Renewable Energy Laboratory. The government has certain rights in this invention.

FIELD OF THE INVENTION

The present invention relates generally to photovoltaic cells and the layered structure thereof. More particularly, the present invention relates to a back contact buffer layer of a thin-film photovoltaic cell.

BACKGROUND OF THE INVENTION

There is no admission that the background art disclosed in this section legally constitutes prior art.

It is well known that solar cells or photovoltaic cells (PV cells) can be used to convert solar energy into current and voltage, or electric energy. Typical photovoltaic cells include a substrate and two ohmic contacts (i.e., electrode layers) for passing current to an external electrical circuit. The cell also includes an active semiconductor junction, usually comprised of two or three semiconductor layers in series. The two-layer type of semiconductor cell consists of an n-type layer and a p-type layer. The three-layer type includes an intrinsic (i-type) layer positioned between the n-type layer and the p-type layer for absorption of light radiation. The photovoltaic cells operate by having readily excitable electrons that can be energized by solar energy to higher energy levels, thereby creating positively charged holes and negatively charged electrons at the interface of various semiconductor layers. The creation of these positive and negative charge carriers creates a net voltage across the two electrode layers in the photovoltaic cell, and establishes a current of electricity.

In order to improve the performance of photovoltaic cells, it is advantageous to decrease the thickness of the various protective and active layers to reduce materials usage and weight, improve mechanical flexibility, and improve light transmissibility into and through the structure. Thin-film and ultra-thin-film photovoltaic cells utilize thin-film semiconductor materials to form the various active layers of the cells. These thin film semiconductor materials offer several distinct advantages over thicker crystalline materials, insofar as they can be easily and economically fabricated into a variety of devices by mass production processes.

As the thickness of the various functional layers decreases, the impact of defects within the layer structures and at the layer junction interfaces becomes more pronounced. One such defect is the presence of current-shunting, short circuit defects. These defects seriously impair the performance of the photovoltaic devices fabricated from thin film semiconductor materials and also detrimentally affect production yield. These process-related defects are thought to either be present in the morphology of the substrate electrode, or develop during the deposition or subsequent processing of the semiconductor layers.

Shunt defects are present in photovoltaic devices when one or more low resistance current paths develop through the semiconductor body of the device, allowing current to pass unimpeded between the electrodes thereof. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "short out" the device.

In certain instances, barrier layers may provide passivation of shunt defects. U.S. Pat. No. 4,251,286 to Barnett shows PV cells having n- and p-layers made from copper sulfide and cadmium sulfide forming a heterojunction interface. In one embodiment, the PV cells may include a blocking layer (16) of zinc sulfide formed between the collector p-layer (12) and the back contact (14). In another embodiment, the blocking layer may be a localized cadmium sulfate layer (17) disposed on the exposed portions of the cadmium sulfide active layer.

U.S. Pat. No. 4,598,306 to Nath et al. shows barrier layers formed from oxides, nitrides and carbides of indium, tin, cadmium, zinc, antimony, silicon, and chromium. These barrier layers are transparent and preferably applied between a transparent electrode and the semiconductor body. Such barrier layers were applied to amorphous silicon p-i-n-PV cells having a stainless steel back contact.

U.S. Pat. No. 7,098,058 to Karpov et al. discloses a method of applying a bonding material onto a semiconductor layer having electrical non-uniformities. The formed semiconductor layers of a photovoltaic cell are immersed into a solution of the bonding material and an electrolyte. The semiconductor layers are energized by way of light energy causing an electrical potential within the semiconductor layers. The bonding material is carried to the semiconductor surface by an electrochemical reaction that causes a redistribution of the positive and negative ions of an electrolyte solution. The bonding material becomes selectively applied to areas of aberrant electric potential by way of the energized semiconductor layers.

Thus, it would be desirable to provide a buffer or barrier layer that is compatible with CdS/CdTe flexible, thin film PV cells that is effective for CdTe layers of about 0.5 microns or less and convenient to apply.

SUMMARY OF THE INVENTION

The present invention relates generally to photovoltaic cells and methods for the fabrication thereof. More particularly, the present invention relates to a photovoltaic cell having a buffer layer and a method of manufacturing photovoltaic cell having such a buffer layer.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
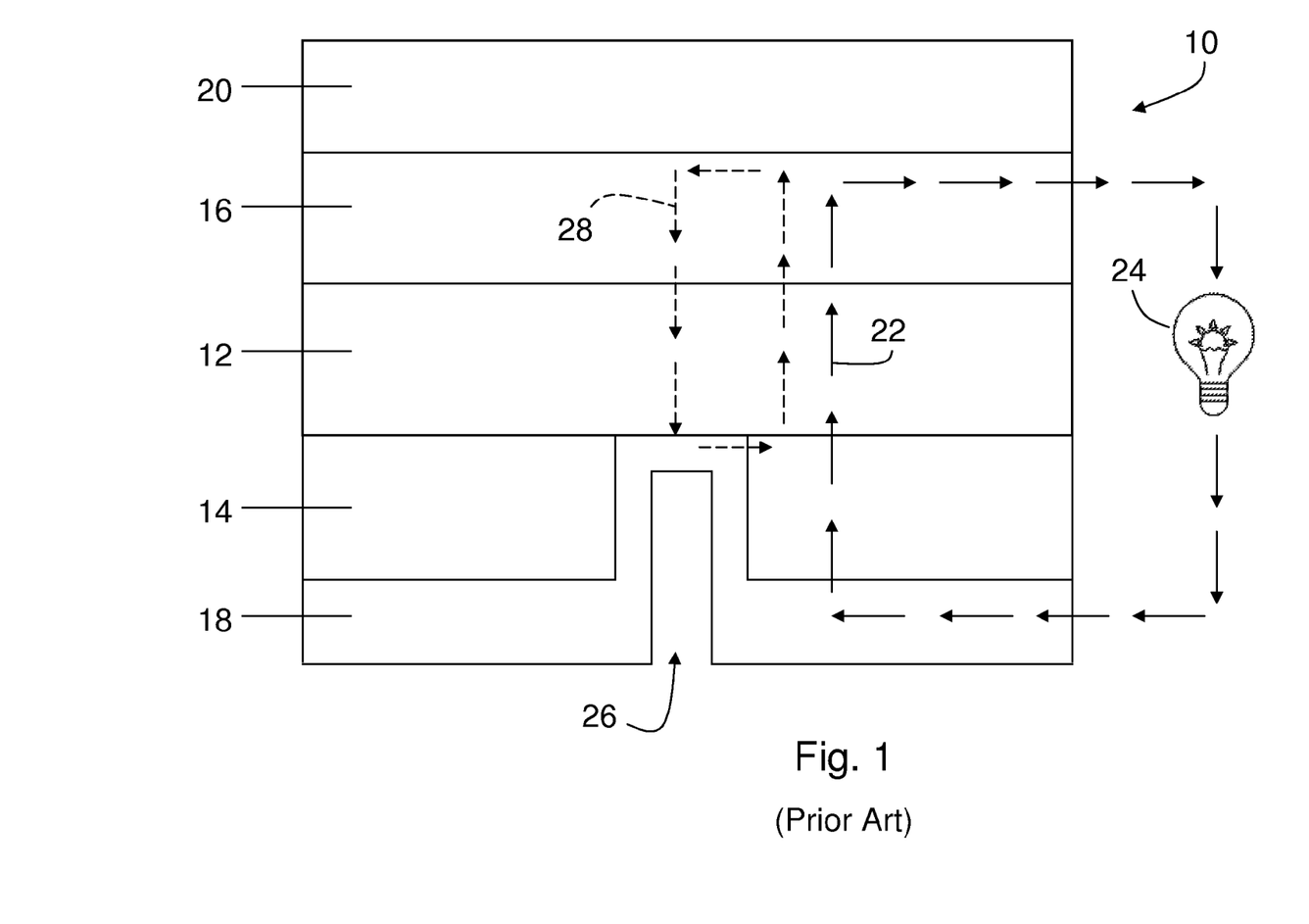
FIG. 1 is a schematic view of a prior art photovoltaic cell showing current flow in a closed circuit pathway and a shunted circuit pathway.

Referring now to the drawings, there is illustrated in FIG. 1 a prior art photovoltaic (PV) cell, shown generally at 10, having two active semiconductor layers: an n-type layer formed of cadmium sulfide (CdS) 12, and a p-type layer formed of cadmium telluride (CdTe) 14. These semiconductor layers are connected between a transparent conductive oxide (TCO) front electrode 16 and a back contact (back electrode) 18. A protective transparent substrate (or superstrate) 20, e.g., glass or polymer film, forms the outermost layer. When exposed to sunlight, the PV cell produces an electrical output, shown schematically as current flow 22, that powers an external load 24.

There is also illustrated schematically in FIG. 1, a structural non-uniformity or electrical defect, such as a pinhole occurring in the p-type semiconductor layer 14, which is one example of an electrical shunt 26. During the metallization process, the back contact may partially fill the pinhole bridging the internal electrical pathway and causing the shunt 26. The shunt 26 provides a low resistance path between the front and back electrodes, as illustrated by a short-circuited current path 28. Various other structural non-uniformities or defects may exist throughout portions of the semiconductor layers. They may occur for numerous reasons, and can include defects caused by the deposition process used to form the semiconductor layers or defects caused by morphological irregularities in the deposition surface of the substrate layer. The resulting short-circuit connection or shunt 26 allows electrical current to flow directly through the PV cell, as shown by the short-circuit current path 28, thus bypassing the working load 24 such as a motor or a light.

While not illustrated, other defects may also form shunts 26. Some examples include projections extending from one active layer to one contact or craters that reduce the material thickness of the active layers between the electrodes. Other electrical anomalies may also include weak diodes which are areas of the PV cell structure that exhibit forward current leakage paths. Materials, such as dopants used to form the various layers of the PV cell, may also diffuse through the cell layers and inhibit electrical output of the cell 10. In addition, PV cells have intentional discontinuities such as scribe lines, which are areas of separation within a layer, intentionally created, to electrically separate contiguous cells within a cell array.

Figure 2:
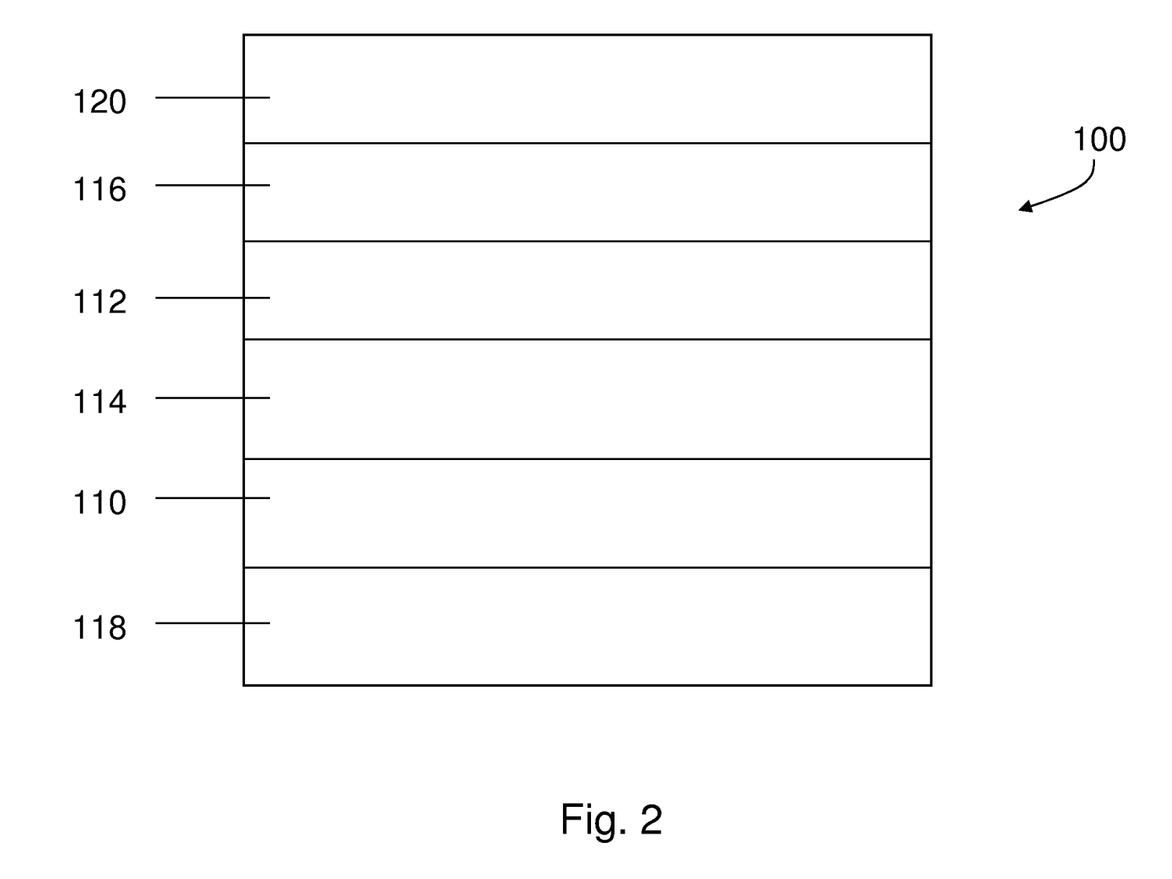
FIG. 2 is a schematic view of an embodiment of a photovoltaic cell having a buffer layer.

Referring now to FIG. 2, there is illustrated one embodiment of a CdS/CdTe PV cell, shown generally at 100 having a buffer layer 110. In one embodiment of the PV cell 100, the buffer layer is configured as a CdS buffer layer 110. The PV cell 100 includes a substrate layer 120, which may alternatively be configured as a superstrate layer depending on the formation sequence of the other layers or the orientation of the PV cell 100 relative to the overhead sun when it is used. The substrate layer 120 may be formed from a transparent polymer such as, for example, polyimide, a glass material such as, for example, soda-lime glass, or any other suitable material through which light may pass. The substrate layer 120 may be flexible. A TCO front contact 116 is formed next to the substrate layer 120. The TCO layer 116 may be, for example, a zinc oxide (ZnO) layer or any other transparent material capable of forming part of the PV cell electric circuit. Active semiconductor layers, such as an n-type layer 112 and a p-type layer 114 are in electrical communication with the TCO layer 116 and a back contact layer 118. In the embodiment shown in FIG. 2, the semiconductor layers are an n-type CdS layer 112 and a p-type CdTe layer 114. Alternatively, other materials or alloys, such as Group II-VI alloys, may be used to form the semiconductor layers. Though not shown, an intrinsic (i.e., i-type) layer may be deposited between the n-type and p-type layers, forming a p-i-n semiconductor configuration. Alternatively, the semiconductor layers may be a plurality of interconnected p-n or p-i-n semiconductor layers. Additionally, the semiconductors layers may be arranged as n-p or n-i-p layers. In one non-limiting example, the CdS buffer layer 110 is formed between the back contact 118 and the CdTe p-layer 114 in a multilayer CdTe-based solar cell.

Figure 3:
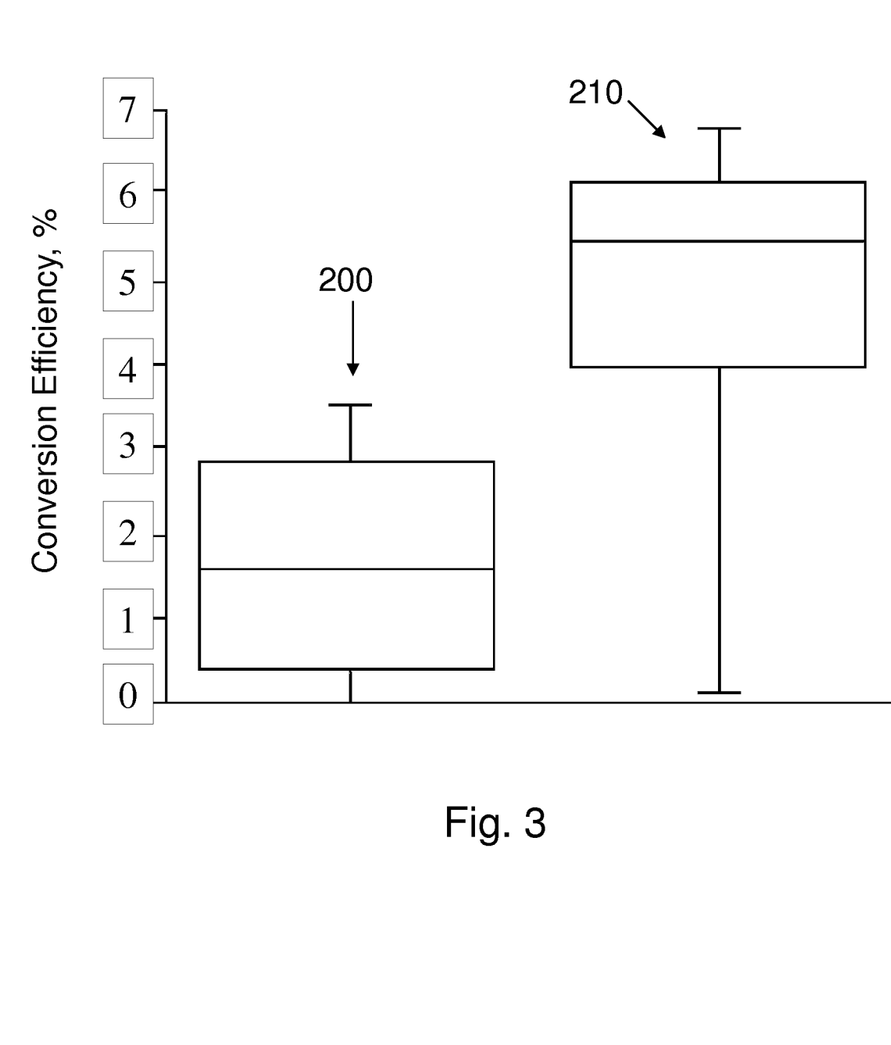
FIG. 3 is a comparative box-and-whisker plot of conversion efficiencies for 35 PV cells with and without a buffer layer, where the CdTe layer thickness is about 0.3 µm.

As shown in FIG. 3, there are illustrated box-and-whisker plots of conversion efficiencies of cells with and without the CdS back buffer layer 110. The box-and-whisker plot 200 illustrates the conversion efficiency (Y-axis, expressed as percentage) of a standard PV cell, similar to the PV cell 10 of FIG. 1 without the shunt 26. The box-and-whisker plot 210 is a comparative efficiency plot of the PV cell 100. Data generated from tests of the above-described CdS/CdTe p-n PV cell embodiment, similar to the embodiment of FIG. 2, shows a substantial increase in conversion efficiency of a thin-film PV device having the CdS buffer layer 110. This buffer layer 110 is also effective for ultra-thin film PV devices. In the embodiment of the PV cell 100 used to develop the plots shown in FIGS. 3-5, the CdTe layer 114 is approximately 0.3 microns (nm). The thickness of the CdTe layer 114, however, may be 0.5 µm or less.

Figure 4:
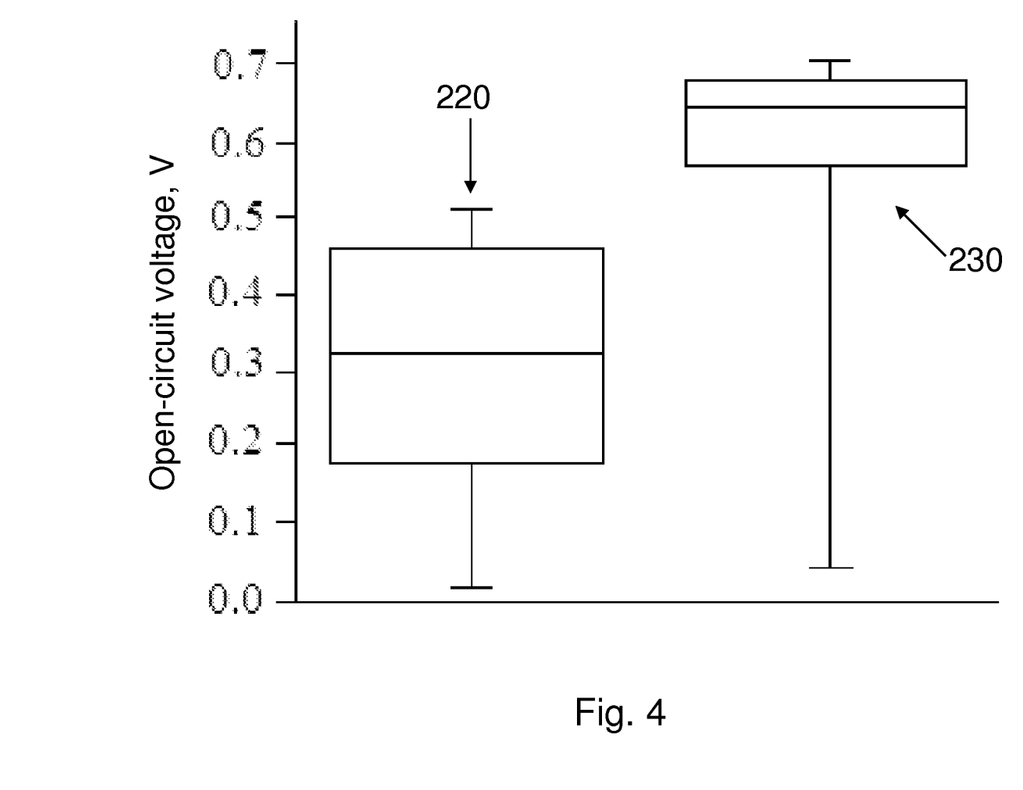
FIG. 4 is a comparative box-and-whisker plot of open-circuit voltage measurements for PV cells with and without a buffer layer, where the CdTe layer thickness is about 0.3 µm.
Figure 5:
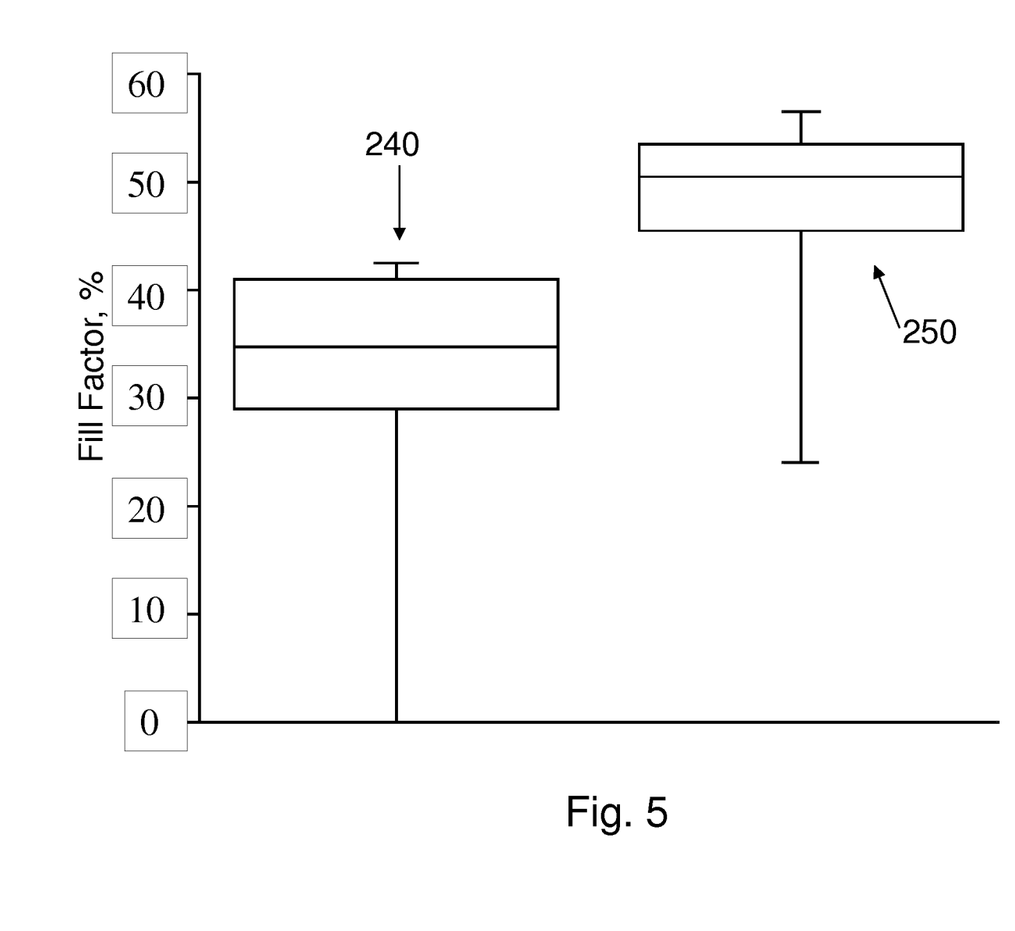
FIG. 5 is a comparative box-and-whisker plot of fill factor measurements for PV cells with and without a buffer layer, where the CdTe layer thickness is about 0.3 µm.

The addition of the CdS buffer layer 110, as shown in the box-and-whisker plots of FIGS. 3-5, has particular advantages in efficiency and yield of the solar cells. Referring now to FIG. 4, there is illustrated a comparative plot of open circuit voltages (Y-axis, expressed in volts) for the PV cell 10 and the buffered PV cell 100. As referred to in describing the comparative box-and-whisker plots, the PV cell 10 was constructed without an electrical defect, as shown in FIG. 1. The plot 220 shows a lower range of open circuit voltage for the conventional PV cell 10. The plot 230 illustrates the improvement made by the addition of the back buffer layer 110 in the buffered PV cell 100. As can be seen from the comparative plots 220 and 230, the PV cell 100 exhibits a more consistent and higher value for open circuit voltage as shown by the higher and narrower box portion of the plot 230. As shown in FIG. 5, the fill factor (Y-axis, expressed as percentage) of the PV cell 10, shown as plot 240, exhibits a lower fill factor percentage than shown by plot 250 representing the PV cell 100.

The presence of the CdS buffer layer 110 allows the PV cell 100 to be made with a thinner CdTe p-type layer 114 than has been generally possible on prior PV cells, such as PV cell 10. In certain embodiments, an ultra-thin CdTe layer may be on the order of 0.5 micron (500 nm) or less in thickness. Additionally, thickness ranges outside of those for the ultra thin CdTe layer may also be similarly benefitted. The data, plotted in FIGS. 3-5, was generated with PV cells having a p-type CdTe layer 14 and 114 of approximately 0.3 microns in thickness. These box-and-whisker plots illustrate three important figures of merit (efficiency, open circuit voltage, and fill-factor) for ensembles of 35 small-area cells. (The box and whisker plots indicate the median value as the interior line, the top and bottom of the box indicates the 75% and 25% percentile, and the extremes show the 95% and 5% percentiles.) As shown in FIGS. 3-5, the shunt-passivation properties of the CdS buffer layer 110 provide increased conversion efficiencies, increased open-circuit voltage, and increased percentage of fill-factor.

Figure 6:
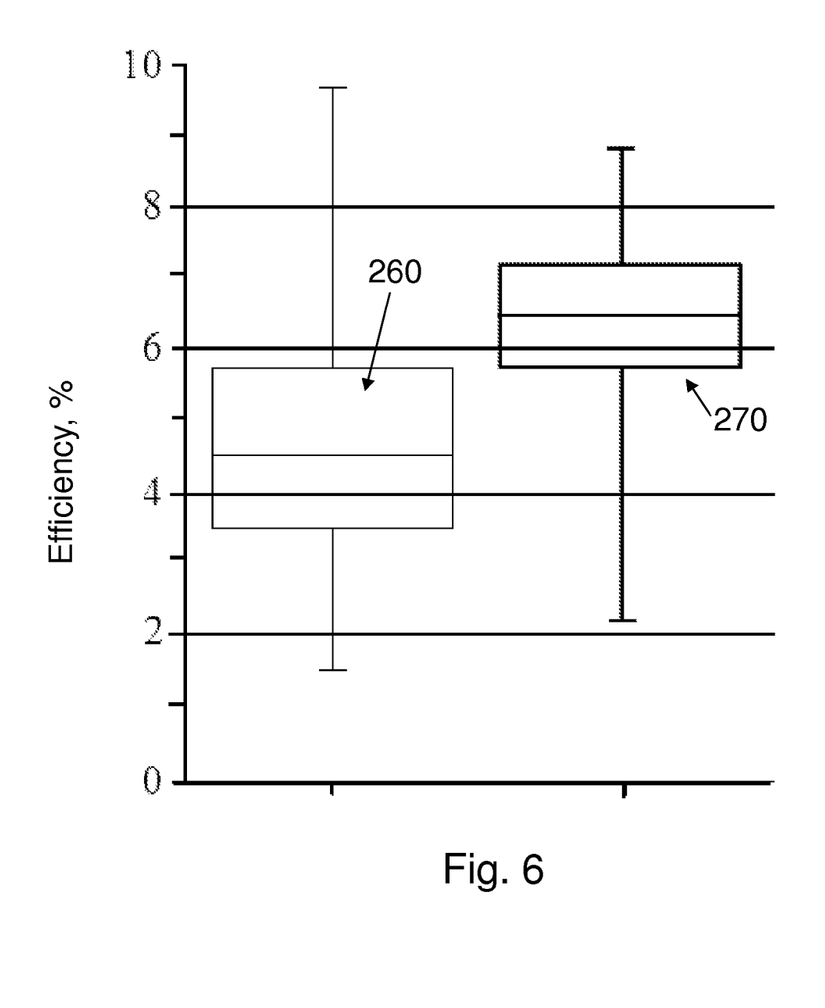
FIG. 6 is a comparative box-and-whisker plot of % Efficiency for a CdS/CdTe PV cell and a CdS/CdTe/CdS cell formed using manufacturing parameters defined by a first embodiment, each having a CdTe layer thickness of 0.5 µm.
Figure 7:
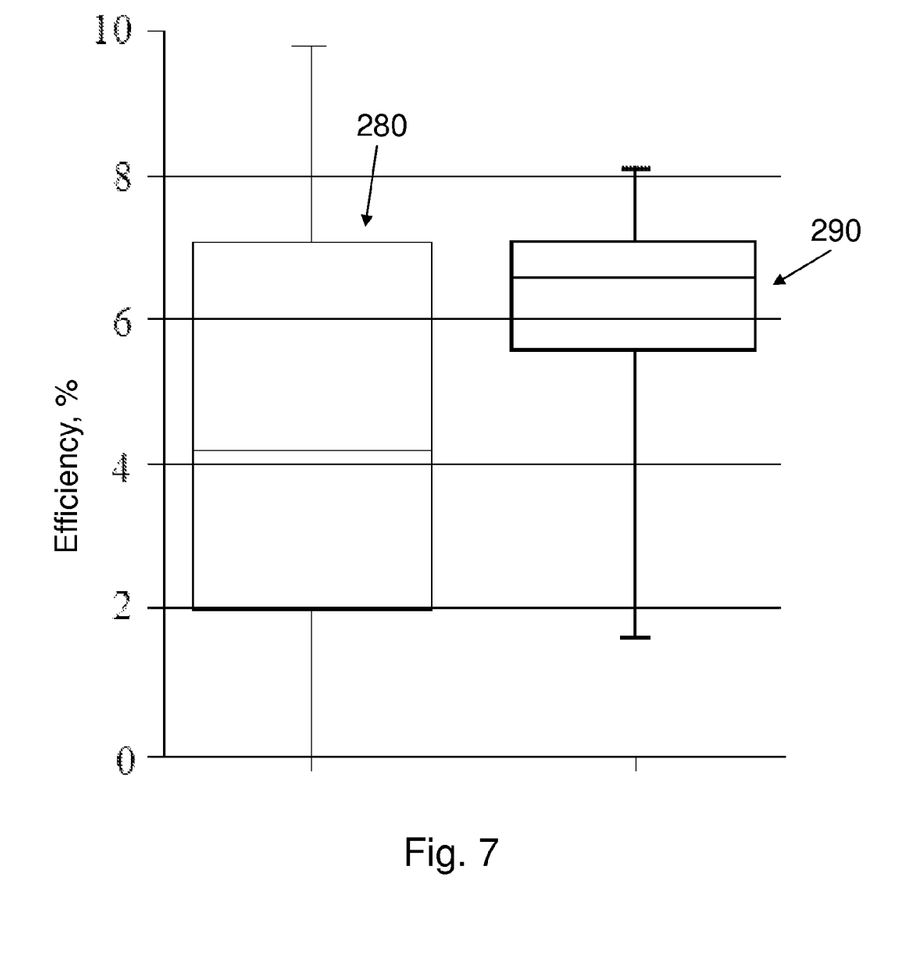
FIG. 7 is a comparative box-and-whisker plot of % Efficiency for a CdS/CdTe PV cell and a CdS/CdTe/CdS cell formed using manufacturing parameters defined by a second embodiment, each having a CdTe layer thickness of 0.5 µm.

Referring now to the box-and-whisker plots of FIGS. 6 and 7, there are illustrated comparative efficiency plots of conventional PV cells, similar to the PV cell 10, and CdS buffered PV cells, similar to the PV cell 100. The data, plotted in FIGS. 6 and 7, was generated from PV cells having a CdTe p-type layer thickness of approximately 0.5 microns. As shown in FIG. 6, the plot 270 of efficiency of the buffered PV cell 100 shows the average efficiency to be higher by about 2% absolute and the variation of efficiency is smaller than for PV cell 10. PV cell 10 differs from PV cell 100 in that a back buffer layer 110 of FIG. 2 has been added to the structure of FIG. 1. In one embodiment of the PV cell 100, buffer layer 110 consists of a sputtered CdS layer.

It is to be understood that, in PV cells, CdS is used as an n-type semiconductor layer. As such, applying another layer formed from an n-type material, such as CdS, to create a n-type CdS/p-type CdTe/n-type CdS cell structure would normally be highly unfavorable for solar cell operation. The inventors herein have discovered that the insertion of a CdS buffer layer results in remarkably improved cell performance. While not wishing to be bound by theory, the inventors believe that the improvements in PV cells may be due, in part, to an altered property of the CdS buffer layer 110. The CdS back buffer layer 110, unlike the front CdS active layer 112, changes its conductivity type to intrinsic or slightly p-type during the post-deposition steps of the fabrication process. The resulting CdS buffer layer 110 serves as a buffer/passivation layer at CdTe/Back contact interface.

While not wishing to be bound by theory, the inventors now believe that the presence of the back contact 118 may also influence the change in conductivity of the CdS buffer layer 110 to intrinsic or slightly p-type during the post-deposition steps of the fabrication process. In one embodiment of the PV cell 100, the back contact 118 can be made from or include, for example, elemental forms of one or more of copper, silver, gold, titanium, carbon and molybdenum. In another embodiment, the back contact 118 may be made from any suitable conductive material, which may be doped or alloyed with, for example, elemental constituent forms of one or more of copper (Cu), silver (Ag), gold (Au), titanium (Ti), carbon (C), and molybdenum (Mo). In one embodiment, the carbon material may be a carbon nanotube material. In general, these elements may include Group I elements of the Periodic Table which, when substituted for the Group II element, i.e., cadmium (Cd) in the CdS, will tend to compensate the natural n-type activity of the adjacent CdS blocking layer. In the alternative or additionally, Group V elements may be substituted for the Group VI element, i.e., sulfur (S) in the CdS, will also tend to compensate the natural n-type activity of the adjacent CdS blocking layer. In a broad aspect of the invention, the conductive material of the back contact 118 may be characterized by those materials exhibiting a high work function. The work function of the conductive material may be generally defined as the energy required to remove an electron from just below the surface of a substance into the vacuum space. The work function may be characterized by the energy used to liberate the electrons such as, for example, a photoelectric work function using photon energy, a thermionic work function using heat energy, and a field electron emission using an electric field. The value of work function for generally applicable conductive elements may be in the general range of approximately 4.5 to 5.5 eV. Some applicable materials, such as for example titanium (Ti), may be slightly outside of the lower end of this range.

While further not wishing to be bound by theory, the inventors believe that certain constituents in the back contact 118 such as Cu 300, for example, diffuse or otherwise migrate into the CdS buffer layer 110. The copper 300 exhibits a strong affinity for CdS and causes the CdS layer to lose its n-type conductivity. The Cu 300 may change the conductivity of the CdS buffer layer 110 to an intrinsic (i-type) layer or a slightly p-type layer.

Figure 8:
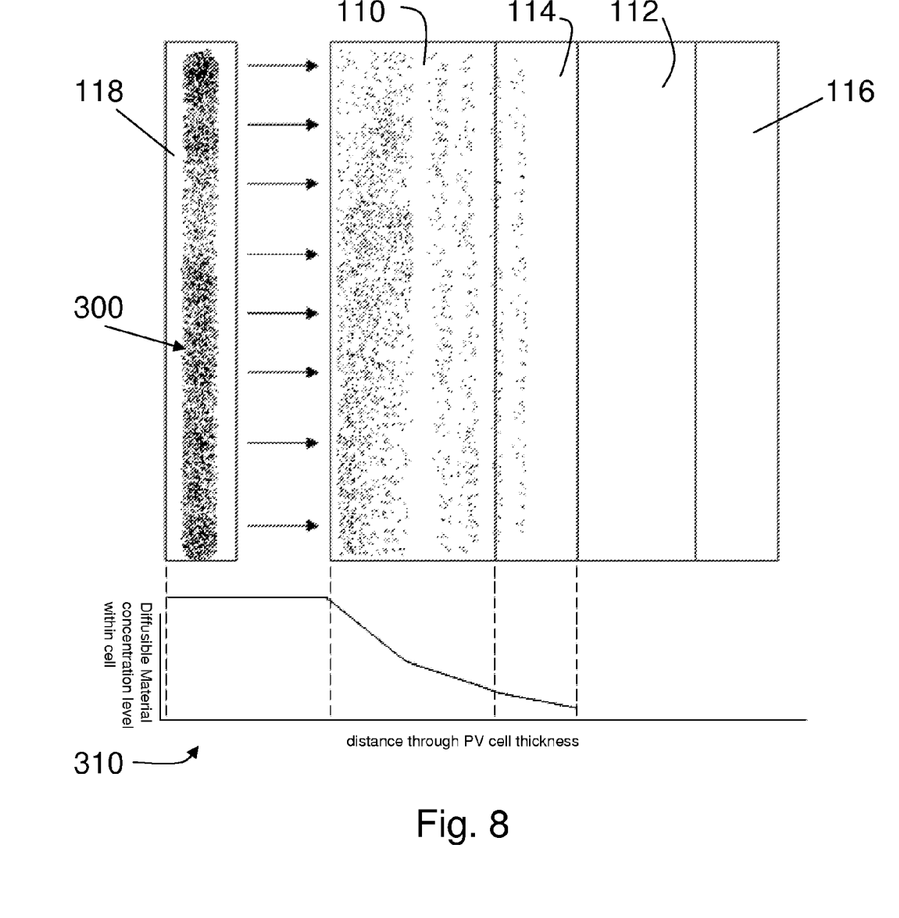
FIG. 8 is a schematic representation of a concentration gradient of material diffused through the thickness of an embodiment of a PV cell.

As a continuing expression of non-binding theory, the inventors believe that the Cu 300 diffuses through the CdS buffer layer 110 exhibiting a concentration gradient, shown generally at 310 that is greater near the source of Cu 300. FIG. 8 illustrates a schematic representation of one such concentration gradient 310 across the CdS buffer layer 110. Other concentration gradients of Cu 300 or other appropriate conductivity killing materials may be used. In one embodiment, the gradient 310 is generally isolated to CdS buffer layer 110. In another embodiment, the concentration gradient 310 of Cu 300 diffuses through the CdS buffer layer 110 and further diffuses through a portion of the CdTe p-type layer 114, terminating prior to reaching the CdS n-type layer 112. The diffusion of Cu 300 can occur during the manufacturing process or after assembly and may be further based on exposure to elevated temperatures. In one embodiment, the Cu source 300 is the back contact 118. In another embodiment, the Cu 300 is applied as either a coating on the back contact 118, a thin elemental layer, or a dopant applied to the CdS buffer layer 110. In one embodiment, the diffusible Cu material 300 may alternatively be silver, gold, molybdenum, titanium, or carbon. A target source can be provided for depositing the dopant onto the CdS buffer layer 110, where the target source includes at least one of copper, silver, gold, molybdenum, titanium, or carbon. The dopant can be deposited within the same deposition chamber as the CdS buffer layer. In yet another embodiment, a thermal energy input, from any suitable source, may be provided on the order of 150° C. to facilitate diffusion of the diffusible material 300 into the buffer layer 110.

In another embodiment, the CdS buffer layer 110 may be produced in a stoichiometric proportion of cadmium and sulfur. Such a proportion causes the CdS buffer layer 110 to exhibit an insulating characteristic consistent with an intrinsic (i-type) layer. This stoichiometric composition of the buffer layer may be contrasted with the slightly sulfur-deficient nature of the CdS n-type semiconductor layer 112. Such n-type behavior in CdS may also be produced by doping with a Group III element such as indium or with a Group VII element such a chlorine. The advantage of a high resistivity CdS buffer layer 110 is the ability to reduce the thickness of the CdTe layer 114, while maintaining high PV cell performance. This reduction in thickness of the CdTe layer has many benefits. Reduction in the CdTe layer thickness reduces the amount of tellurium thus lowering manufacturing costs due to the expense of tellurium, which is a rare element. A thinner CdTe layer 114 reduces the amount of cadmium which reduces fabrication costs and reduces the potential for heavy metal pollution. Another benefit is the improved transparency of the thinner CdTe layer 114.

In certain embodiments, improved transparency through a thinner CdTe layer 114 permits more light wavelengths to pass through to lower layers, such as those in double and triple junction cells. The improved transparency allows the PV coating to be semi-transparent, which is useful for window applications. Additionally, the thin PV layers allow the use of a back reflector that permits more light to be directed back through the cell for subsequent electron excitation, which improves efficiency. As a frame of reference, known PV cells have been constructed with CdTe layers on the order of 2.3-3.5 microns and as high as 10 microns. By contrast, the inventors have now shown that the thickness of the CdTe layer 114, when used in conjunction with the CdS buffer layer 110 has been produced in a range of 0.5 microns and 0.3 microns and may be still further reduced.

In another embodiment of a photovoltaic cell having a CdS buffer layer, an intrinsic layer may be disposed between the n-type CdS layer 112 and the p-type CdTe layer 114, in the form of a generic n-i-p structure. A portion of such a PV cell structure may be in the form of a n-type CdS/i-type layer/p-type CdTe/CdS buffer layer. In certain embodiments, the i-type layer may be formed from a variety of materials such as, for example, an i-type CdTe layer in conjunction with the p-type CdTe layer. In another embodiment, the PV cell may be configured as n-type CdS/i-type CdTe/p-type ZnTe/CdS buffer layer.

Unlike other existing buffer layers and shunt passivation schemes, the CdS buffer layer 110 uses the same material that is already used in the cell fabrication process. Thus, the buffer layer 110, and its application onto the cell, can be performed in the same deposition chamber where the main CdS and CdTe layers are deposited. In this case no vacuum break or other steps associated with use of an additional apparatus are necessary.

The substrate material is moved to a suitable processing environment for deposition of the TCO layer 116. In one embodiment of the method of forming the PV cell 100, the TCO layer 116 is deposited by a form of sputtering such as, for example, RF sputtering, magnetron sputtering, and the like. It should be understood that any suitable application process may be used to form the TCO layer 116.

The various active semiconductor layers (CdS 112, CdTe 114, and the like) are deposited onto the TCO layer 116. In the embodiment shown in FIG. 2, the semiconductor layers are deposited as a n-CdS layer 112 and a p-CdTe layer 114. Other layers, such as an intrinsic layer or numerous stacked semiconductor layers, may be formed on the previously applied portions of the cell if desired.

In one embodiment of the method, the semiconductor layers are deposited by sputtering. The semiconductor layers are sputter deposited within an evacuated sputtering chamber that contains a target source of CdS and a target source of CdTe.

Once the semiconductor layers have been formed, a CdS buffer layer 110 is applied onto the CdTe layer 114. In certain embodiments, the CdS buffer layer 110 can have a thickness that ranges from about 30 nm to about 50 nm. In one embodiment, the CdS buffer layer 110 is deposited by sputtering. In yet another embodiment, the CdS buffer layer 110 is sputter deposited onto the CdTe layer 114 within the same sputtering deposition chamber and using the same CdS target source. In yet another embodiment, the CdS buffer layer 110 is deposited within the same sputtering chamber but using a different sputtering source. In yet another embodiment, the CdS buffer layer 110 is deposited in a different chamber using sputtering, evaporation, chemical bath deposition, or other suitable method for depositing the CdS.

The back CdS buffer layer 110 is deposited with similar deposition parameters that are used for the front CdS layer 112. For example, in one embodiment of the deposition process, the parameters may comprise 35 W of RF (radio frequency, 13.56 MHz) power, 18 mTorr Ar sputter gas pressure, and 250° C. substrate temperature. Alternatively, other deposition parameters may be used such as, for example, 20 W of RF power, 18 mTorr Ar gas pressure. Alternatively, the power and pressure levels may further be changed to 40 W of RF power and 9 nTorr Ar gas pressure. In one embodiment of the PV cell 100 having the back contact buffer layer 110, the ultra-thin (less that 0.5 micron CdTe) cells may have an optimum thickness of the back CdS buffer layer 110 in the range of 30 nm to 50 nm. While not wishing to be bound by any particular theory, the inventors have found that the optimum CdS thickness depends on the thickness of the absorber (CdTe) layer and whether the back CdS buffer layer 110 is deposited prior to or after a $CdCl_2$ annealing treatment. In one embodiment, the $CdCl_2$ annealing treatment may be conducted at a temperature of approximately 400° C. In one embodiment of applying the back contact buffer layer, the back CdS buffer layer 110 is applied prior to the $CdCl_2$ treatment process. In another embodiment of a method of applying a back buffer layer, the back CdS buffer layer 110 may be applied after the $CdCl_2$ treatment. In another embodiment, the $CdCl_2$ annealing treatment is conducted after the step of applying a back contact layer onto the CdS buffer layer.

After completion of the CdS buffer layer deposition/$CdCl_2$ treatment or $CdCl_2$ treatment/CdS buffer layer deposition sequence, the back contact 118 is applied onto the CdS buffer layer 110. The back contact 118 is electrically connected to the cell 100. The electrical connections may be formed in an offline process whereby connections are formed between selected portions of the active layers and the back contact. Alternatively, the electrical connections may be made internally by scribing.

The principle and mode of operation of this invention have been explained and illustrated in its preferred embodiment. However, it must be understood that this invention may be practiced otherwise than as specifically explained and illustrated without departing from its spirit or scope.

What is claimed is:
1. A photovoltaic cell comprising:
   a substrate layer;
   a transparent conductive contact layer;
   a semiconductor comprising:
      a cadmium sulfide (CdS) layer having an n-type conductivity characteristic; and
      a cadmium telluride (CdTe) layer having a p-type conductivity characteristic;
   a buffer layer comprised of cadmium sulfide (CdS); and,
   a back contact layer in direct contact with the buffer layer, the back contact layer comprising a conductive material containing an elemental constituent having a high work function.
2. The photovoltaic cell of claim 1 wherein the buffer layer is disposed between the CdTe layer and the back contact layer, the buffer layer further configured to have one of an intrinsic and slightly p-type conductivity characteristic.

3. The photovoltaic cell of claim 1 wherein the elemental constituent at least partially diffuses into the buffer layer, the elemental constituent having a concentration gradient through the buffer layer such that the concentration of the elemental constituent becomes less as the distance through the buffer layer from the back contact layer increases.

4. The photovoltaic cell of claim 3 wherein the elemental constituent diffuses from the back contact layer into the buffer layer, the diffusion being enhanced by way of thermal energy input.

5. The photovoltaic cell of claim 3 wherein the elemental constituent is copper and the concentration gradient is generally isolated to the CdS buffer layer.

6. The photovoltaic cell of claim 1 wherein the high work function is in the range of approximately 4.5 to 5.5 eV.

7. The photovoltaic cell of claim 1 wherein the elemental constituent comprises at least one of copper, silver, gold, titanium, carbon, and molybdenum.

8. The photovoltaic cell of claim 1 wherein the elemental constituent comprises a coating, a dopant, or a thin elemental layer, wherein the elemental constituent diffuses into the buffer layer to establish an elemental constituent gradient through at least the buffer layer.

9. The photovoltaic cell of claim 8 wherein the elemental constituent is one of copper, silver, gold, titanium, carbon, and molybdenum that at least partially diffuses through the CdS buffer layer and further at least partially diffuses through a portion of the CdTe p-type layer.

10. The photovoltaic cell of claim 1 wherein the CdS buffer layer has a thickness in a range of about 30 nanometers to about 50 nanometers.

11. The photovoltaic cell of claim 10 wherein the CdTe layer has a thickness in a range of about 300 nanometers to about 500 nanometers.

12. The photovoltaic cell of claim 10 wherein the CdS buffer layer has been exposed to vapors of cadmium chloride ($CdCl_2$).

13. The photovoltaic cell of claim 11 wherein the CdTe layer has been exposed to vapors of cadmium chloride ($CdCl_2$) before the CdS buffer layer is applied.

14. The photovoltaic cell of claim 1 wherein the semiconductor is a plurality of interconnected p-n or p-i-n semiconductor layers formed in a multi-junction cell configuration.

15. The photovoltaic cell of claim 1 wherein the CdS buffer layer improves at least one photovoltaic cell characteristic of efficiency, open circuit voltage, and fill-factor.

16. A photovoltaic cell comprising:
a flexible, transparent substrate layer;
a transparent conductive oxide layer;
a cadmium sulfide layer having an n-type conductivity characteristic;
a cadmium telluride layer having a p-type conductivity characteristic;
an intrinsic layer disposed between the cadmium sulfide layer and the cadmium telluride layer;
a buffer layer comprised of cadmium sulfide on the cadmium telluride layer; and,
a back contact layer in direct contact with the buffer layer, the back contact layer comprising a conductive material containing an elemental constituent having a high work function.

17. A photovoltaic cell comprising:
a flexible, transparent substrate layer;
a transparent conductive oxide layer;
a cadmium sulfide layer having an n-type conductivity characteristic;
a cadmium telluride layer having an intrinsic (i-type) characteristic;
a zinc telluride layer having a p-type conductivity characteristic;
a buffer layer comprised of cadmium sulfide; and,
a back contact layer in direct contact with the buffer layer, the back contact layer comprising a conductive material containing an elemental constituent having a high work function.

18. A method of forming a photovoltaic cell comprising the steps of:
providing a substrate layer;
applying a transparent conductive oxide (TCO) layer onto the substrate layer;
providing a deposition chamber having at least two target sources that include a cadmium sulfide (CdS) target source and a cadmium telluride (CdTe) target source;
depositing a CdS layer onto the TCO layer;
depositing a CdTe layer onto the CdS layer;
depositing a CdS buffer layer onto the CdTe layer within the same deposition chamber, the CdS buffer layer being formed from the CdS target source; and
applying a back contact layer directly onto the CdS buffer layer, the back contact layer comprising a conductive material containing an elemental constituent having a high work function.

19. The method of claim 18 including a cadmium chloride ($CdCl_2$) annealing step prior to the step of applying the back contact layer.

20. The method of claim 18 including a cadmium chloride ($CdCl_2$) annealing step after the step of applying the back contact layer.

21. A method of forming a photovoltaic cell comprising the steps of:
providing a substrate layer;
applying a transparent conductive oxide (TCO) layer onto the substrate layer;
providing a deposition chamber having at least two target sources that include a cadmium sulfide (CdS) target source and a cadmium telluride (CdTe) target source;
depositing a CdS layer onto the TCO layer;
depositing a CdTe layer onto the CdS layer;
depositing a CdS buffer layer onto the CdTe layer, the CdS buffer layer being formed from the CdS target source; and
applying a back contact layer that includes at least one of copper, silver, and gold directly onto the CdS buffer layer.

22. A method of forming a photovoltaic cell comprising the steps of:
providing a substrate layer;
applying a transparent conductive oxide (TCO) layer onto the substrate layer;
providing a deposition chamber having at least two target sources that include a cadmium sulfide (CdS) target source and a cadmium telluride (CdTe) target source;
depositing a CdS layer onto the TCO layer;
depositing a CdTe layer onto the CdS layer;
depositing a CdS buffer layer onto the CdTe layer within the same deposition chamber, the CdS buffer layer being formed from the CdS target source;
depositing a dopant of at least one of copper, silver, gold, molybdenum, titanium, and carbon directly onto the CdS buffer layer; and
applying a back contact layer onto the CdS buffer layer.

23. The method of claim 22 wherein the dopant is deposited within the same deposition chamber as the CdS buffer layer.

24. The method of claim 22 wherein a target source is provided for depositing the dopant, the target source including the at least one of copper, silver, gold, molybdenum, titanium, and carbon.

25. The method of claim 22 further comprising a step of treating the CdS and CdTe layers with an exposure to cadmium chloride ($CdCl_2$) conducted after the steps of depositing the CdS layer onto the TCO layer and depositing the CdTe layer onto the CdS layer.

26. The method of claim 22 further comprising a step of treating the CdS and CdTe layers with an exposure to cadmium chloride ($CdCl_2$) conducted after the step of forming the CdS buffer layer.

27. The method of claim 22 further comprising a step of treating the CdS and CdTe layers with an exposure to cadmium chloride ($CdCl_2$) conducted after the step of applying a back contact layer onto the CdS buffer layer.

28. The method of claim 22 wherein the dopant of at least one of copper, silver, gold, molybdenum, titanium, and carbon diffuses into the CdS buffer layer.

* * * * *